United States Patent [19]

Martinez et al.

[11] Patent Number: 5,066,565
[45] Date of Patent: Nov. 19, 1991

[54] SELECTIVE PROTECTION OF POLY(TETRA-FLUOROETHYLENE) FROM EFFECTS OF CHEMICAL ETCHING

[75] Inventors: Robert J. Martinez; Robert R. Rye, both of Albuquerque, N. Mex.

[73] Assignee: The United States of America as represented by the United States Department of Energy, Washington, D.C.

[21] Appl. No.: 330,032

[22] Filed: Mar. 29, 1989

[51] Int. Cl.$^5$ .................................................. G03F 7/30
[52] U.S. Cl. ..................................... 430/296; 430/966; 430/967; 430/325; 156/659.1; 156/628; 156/654; 156/643; 156/668
[58] Field of Search ............... 430/296, 966, 967, 325; 156/659.1, 628, 654, 643, 668

[56] References Cited

U.S. PATENT DOCUMENTS

| | | | |
|---|---|---|---|
| 2,789,063 | 4/1957 | Purvis | 117/47 |
| 2,809,130 | 10/1957 | Rappaport | 117/138.8 |
| 2,888,367 | 5/1959 | Greyson | 117/138.8 |
| 3,115,536 | 12/1963 | Janis et al. | 156/668 X |
| 3,833,455 | 9/1974 | Rosenblatt, Jr. et al. | 156/654 X |
| 3,853,657 | 12/1974 | Lawton | 156/180 |
| 3,892,884 | 7/1975 | Garratt et al. | 427/36 |
| 4,061,829 | 12/1977 | Taylor | 430/966 X |
| 4,364,792 | 12/1982 | Gliem et al. | 156/628 |
| 4,529,860 | 7/1985 | Robb | 219/121 PE |
| 4,536,271 | 8/1985 | Collins | 204/192 E |
| 4,735,996 | 4/1988 | Nagai et al. | 525/326.4 |
| 4,743,327 | 5/1988 | DeHaan et al. | 156/272.6 |
| 4,915,981 | 4/1990 | Traskos et al. | 156/643 |

FOREIGN PATENT DOCUMENTS

| | | | |
|---|---|---|---|
| 52-40124 | 3/1977 | Japan | 430/966 X |
| 924833 | 5/1963 | United Kingdom | 156/659.1 |

OTHER PUBLICATIONS

A. Benderley, "Treatment of Teflon to Promote Bondability", *Journal of Applied Polymer Science*, vol. VI, Issue No. 20, pp. 221-225, 1962.

D. Wheeler et al., "Effect of X-Ray Flux on Polytetrafluoroethylene in X-Ray Photoelectron Spectroscopy", *J. Vac., Science* Technology, vol. 20, No. 2, pp. 226-232, Feb., 1982.

Primary Examiner—Cynthia Hamilton
Attorney, Agent, or Firm—Armand McMillan; James H. Chafin; William R. Moser

[57] ABSTRACT

A photolithographic method for treating an article formed of polymeric material comprises subjecting portions of a surface of the polymeric article to ionizing radiation; and then subjecting the surface to chemical etching. The ionizing radiation treatment according to the present invention minimizes the effect of the subseuent chemical etching treatment. Thus, selective protection from the effects of chemical etching can be easily provided. The present invention has particular applicability to articles formed of fluorocarbons, such as PTFE. The ionizing radiation employed in the method may comprise Mg(k$\alpha$) X-rays or lower-energy electrons.

9 Claims, 10 Drawing Sheets

SELECTIVE PROTECTION OF POLY(TETRA-FLUOROETHYLENE) FROM EFFECTS OF CHEMICAL ETCHING

The Government has rights in this invention pursuant to Contract No. DE-AC04-76DP00789.

BACKGROUND OF THE INVENTION

1. Field of the Invention

The present invention relates to a treatment of polymeric materials and more particularly to treating a portion of a surface of a polymeric material with radiation to minimize the effect of a subsequent chemical etching treatment, the radiation thus acting as a masking agent.

2. Description of Related Art

There are many applications for bonding articles to polymeric materials. Many of those applications require bonding to selected portions of the polymeric materials. For example, in surface mounted components, which are merely mounted on top of printed wiring boards (PWB), or soft substrate PWB'S, which have all components attached to a soft polymeric substrate, it is necessary to pattern select areas on the printed wiring boards for adhesive attachment. Another application concerns the encapsulation of electronic devices which contain wires insulated by a polymeric material. In such devices, for stress relief of the wires, it is necessary that the wire coating not adhere to the encapsulation material except in areas immediately adjacent to the electronic components. Adhesion over the length of the connecting wires would create stress on the components and would result in high failure rates.

Due to the chemical inertness of many polymeric materials, such as polytetrafluoroethylene (PTFE), it is frequently difficult to provide adequate adhesion. A standard industrial process for improving adhesion of polymeric materials involves chemically etching the surface of the material with a commercially available sodium-containing solution (such as Tetra-Etch (TM), sold by W.L. Gore & Associates) to prepare the surfaces of such materials for adhesion. Chemical etching greatly modifies properties of the material, for example, color, wettability and surface resistance. The etching process produces a highly porous surface, the chemical attack extending to depths up to 10,000 Å.

Selective etching has been accomplished by masking the surface being etched with materials that are both water-tight and chemically impervious to the etching solution.

SUMMARY OF THE INVENTION

The present invention is directed to a method of more simply carrying out selective etching of polymeric materials, in particular, a method for performing selective etching without the need for complex physical protection of selected portions of the sample. The present invention employs photolithographic means for selectively irradiating portions of a surface of a polymeric material. In accordance with the present invention, portions of a surface of a polymeric material are irradiated with ionizing radiation (X-rays or electrons), the irradiation reducing or eliminating the effect of a subsequent chemical etching step.

The present invention comprises:

A photolithographic method for treating an article formed of polymeric material, comprising:

(1) subjecting portions of a surface of the article to ionizing radiation; and then
(2) subjecting the surface to chemical etching.

The present invention is particularly effective for articles formed of fluorocarbons, for example, PTFE.

According to the present invention, the ionizing radiation can comprise X-rays with energies between 25 eV to 1254 eV or low-energy electrons.

BRIEF DESCRIPTION OF THE DRAWINGS

Preferred embodiments of the invention will be described herein in detail with reference to the appended drawings, wherein.

DETAILED DESCRIPTION OF THE PREFERRED EMBODIMENTS

According to the present invention, prior to a chemical etching step, portions of a polymeric material are subjected to ionizing radiation. The radiation may comprise low-energy electrons, preferably from 0.5 KeV to 3.0 KeV, or X-rays from 25 eV to 1254 eV. The radiation is used to produce a desired pattern on the surface of the polymeric material.

When using low-energy electrons, much greater control over irradiation is possible than with X-rays. With electrons, an electron gun with suitable deflection plates can be computer-controlled to selectively irradiate the surface of the polymeric material, and the electron energy and current can be independently varied. The depth of penetration is controlled by varying the electron energy.

When X-rays are employed as the source of irradiation, line-of-sight shielding may be used to provide selective irradiation. Such shielding for X-rays can be formed of metallic, inorganic or organic materials. The shielding material should be easily removable, stable under the X-ray beam, and of sufficient thickness to prevent radiation from reaching the polymeric surface.

Exposure of a polymeric surface, such as the surface of an article of PTFE, to ionizing radiation causes branching and/or cross-linking of the polymer chains in the volume of the article which is exposed (the near surface region). This more rigid, branched volume of the article is resistant to the subsequent chemical etching treatment.

It is well known that radiation-induced cross-linking of PTFE leads to major changes in viscosity, chemical composition and structure. The fact that the same basic effect is observed with X-rays and with electrons over a wide energy range is consistent with the notion that radiation damage of PTFE results from valence excitations of secondary electrons.

Prior to etching, the portions of the article which have been exposed to radiation appear identical to those which have not been exposed to radiation. Analagous to the photographic process, the pattern of irradiation is developed by the chemical etching step.

Following the selective radiation treatment, the polymeric material is subjected to chemical etching. The most widely used method of chemical etching of PTFE involves treating the surface of the polymeric material with sodium either in liquid ammonia or as a 1:1 complex of sodium and naphthalene (Tetra-Etch (TM)). Portions of the polymeric material which have been irradiated are unaffected or less affected by the chemical etching than non-irradiated portions. In particular, the adhesion of irradiated portions is largely unaffected by chemical etching, contrary to non-irradiated portions. The adhesion strength of irradiated portions of an article of PTFE subjected to a dose of 5 $\mu$amp-sec/cm$^2$ of 2 keV electrons (roughly equivalent to $1.6 \times 10^{-4}$ electrons/$CF_2$) is less than 3% (after etching) of that of non-irradiated portions. The radiation dose can be controlled to tailor any desired adhesion strength up to the maximum produced by chemical etching.

Figure 1A:
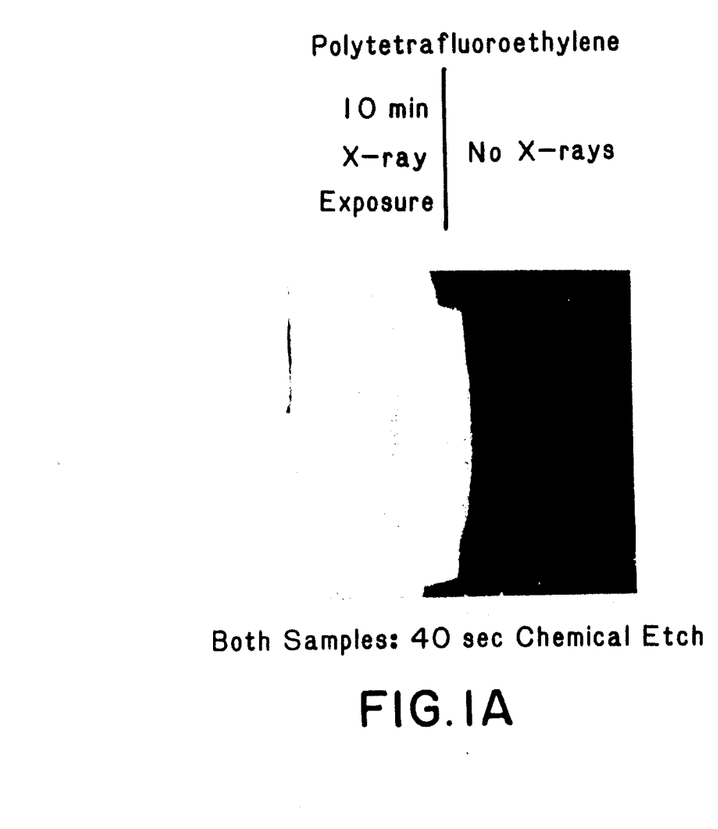
FIGS. 1A and 1B show two PTFE samples which were selectively irradiated and chemically etched.
Figure 1B:
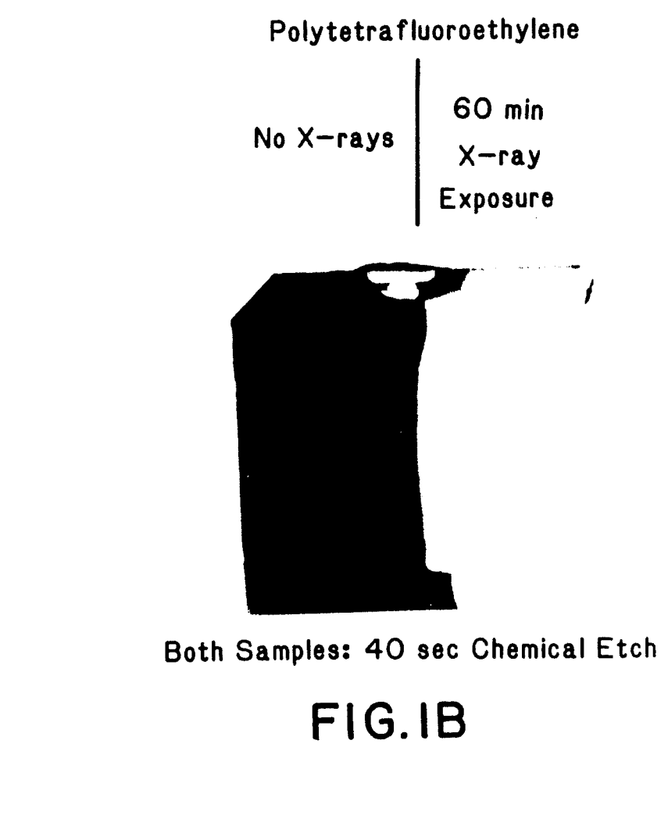

FIGS. 1A and 1B illustrate the visual effects of treatment of PTFE articles according to the present invention. Two PTFE articles were prepared, and half of each article was covered with a thin metal foil and exposed to Mg(k$\alpha$) X-rays for 10 minutes and 60 minutes, respectively. The articles were then subjected to chemical etching. In FIGS. 1A and 1B, the dark portions correspond to the portions of the PTFE article which was not irradiated and the white portions correspond to the areas which were irradiated.

Figure 2:
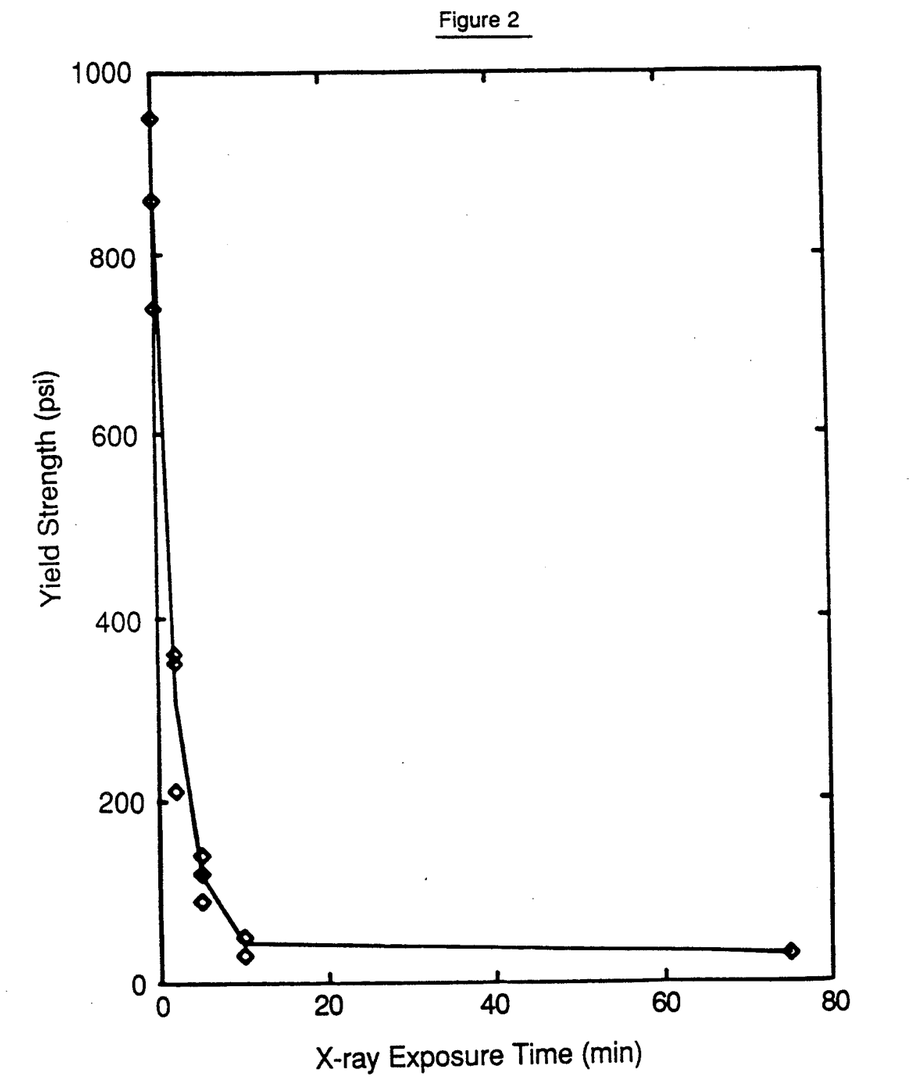
FIG. 2 is a graph of yield strength of an irradiated and etched sample vs. X-ray exposure time.

The degree of protection from chemical etching provided by irradiation is a function of radiation dose, a greater dose providing greater protection against chemical etching. In FIG. 2, the adhesion strength of a PTFE article after irradiation and etching is plotted versus Mg(k$\alpha$) irradiation time.

The C:F ratio (from X-ray photoelectron spectroscopy) after the chemical etching treatment of irradiated portions is similar to that of non-irradiated portions, indicating that good adhesion to PTFE is not simply a result of defluorination.

The effect of X-rays and electrons on the adhesive strength (after etching) of the articles is similar. X-rays and electrons, however, exhibit differing penetration characteristics, resulting in differing cross-link depth distributions. When using X-rays, energy loss is greatest at the surface, but exponentially decreases to depths greater than 50,000 Å. When using electrons, energy loss occurs over shorter distances, but reaches a peak at very near the maximum distance of penetration. For example, 0.5 keV electrons penetrate to only about 100 Å.

From qualitative inspection of the sample color after etching, similar protection is observed for all electron energies from 0.5 keV to 3.0 keV, suggesting that the protection against etching is most sensitive to crosslinking at or near the surface. Quantitatively, for 1.0 keV and 2.0 keV electrons, the same major decrease in adhesion strength occurs as is provided by X-rays. The minimum dose of 2.0 keV electrons required to produce the maximum loss in adhesion strength is approximately 5 amp-sec/cm$^2$, which corresponds to an absorbed dose of roughly $1.6 \times 10^{-4}$ electrons per $CF_2$ unit. This dose is comparable to the minimum dose of Mg(k$\alpha$) X-rays absorbed to the depth to which the electrons penetrate.

EXAMPLE 1

The system used for Example 1 consisted of two interlocked vacuum chambers which allow rapid transfer of samples to an ultra-high vacuum (UHV) chamber. Within the UHV chamber, samples can be rotated to positions for XPS and X-ray irradiation, and for line-of-sight thermal desorption experiments using a quadrupole mass spectrometer. The mass spectrometer is used as well for monitoring the isotropic gas composition during irradiation. For the present experiments, a third electron gun (Physical Electronics Industries model 04-015) was positioned for normal incidence irradiation of the samples, and the locally constructed electronics were modified for computer control of the beam position.

PTFE samples (1.2 cm $\times$ 1.2 cm) were cut from a 0.79 mm thick piece of commercial PTFE. In a typical experiment, the electron beam was rastered in a square pattern on a phosphor screen covering the front plate of a Faraday cup used for accurate current measurement. With the current and pattern stable, the beam was deflected off the screen, a PTFE sample was rotated to the raster position, and the beam was deflected back to the sample position for the start of rastering.

After electron exposure, the sample was chemically etched for 40 seconds in Tetra-Etch, followed by ultrasonic rinses in water, acetone and methyl alcohol. For those samples irradiated for adhesion test purposes, special attention was paid to maintaining a constant procedure and time sequence for all steps following chemical etching. Adhesion strength measurements were made using a small Sabastion I Adherence Tester with aluminum test plugs. The test plugs were freshly etched using a sulfuric acid/sodium dichromate solution to insure that failure did not occur in the bond to the test plug. The test plugs were bonded to the PTFE samples using a quick setting epoxy cured at 100° F. for 2½ hours.

Figure 3:
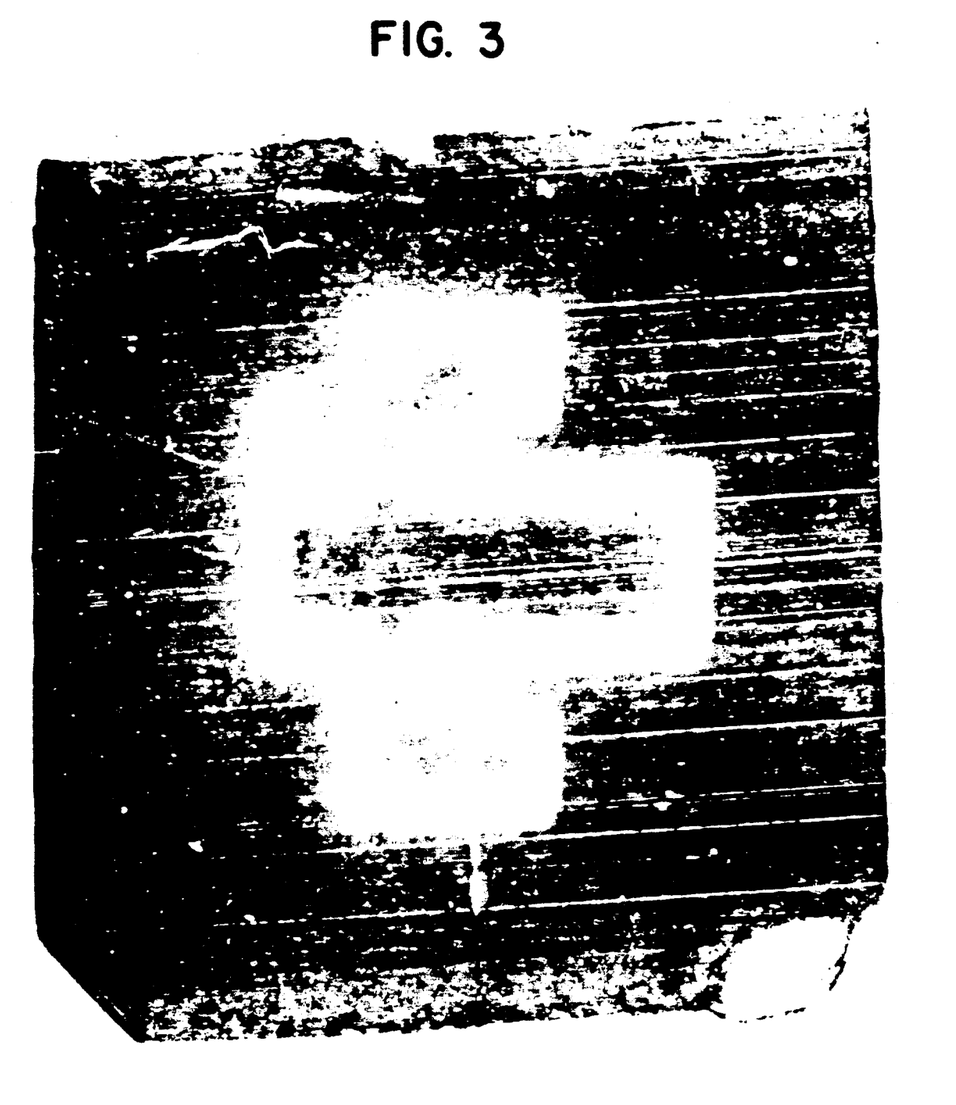
FIG. 3 shows a PTFE sample which was selectively irradiated and chemically etched.

FIG. 3 illustrates the effect of electron irradiation of PTFE on the subsequent etching behavior. A 0.5 $\mu$amp, 2 keV electron beam was rastered over a desired pattern for 30 sec. After etching, the irradiated area exhibited the normal white appearance of PTFE while the nonirradiated areas exhibited the usual dark, discolored appearance of etched surfaces. The width of the pattern was about 0.6 mm, which corresponds to the estimated diameter of the electron beam. Behavior similar to that in FIG. 3 was also obtained for electron energies between 500 eV and 3 keV. The maximum electron energy with the present electron gun is 3.0 keV, and below 500 eV, it is difficult to image the pattern on a phosphorus screen.

EXAMPLE 2

Figure 4:
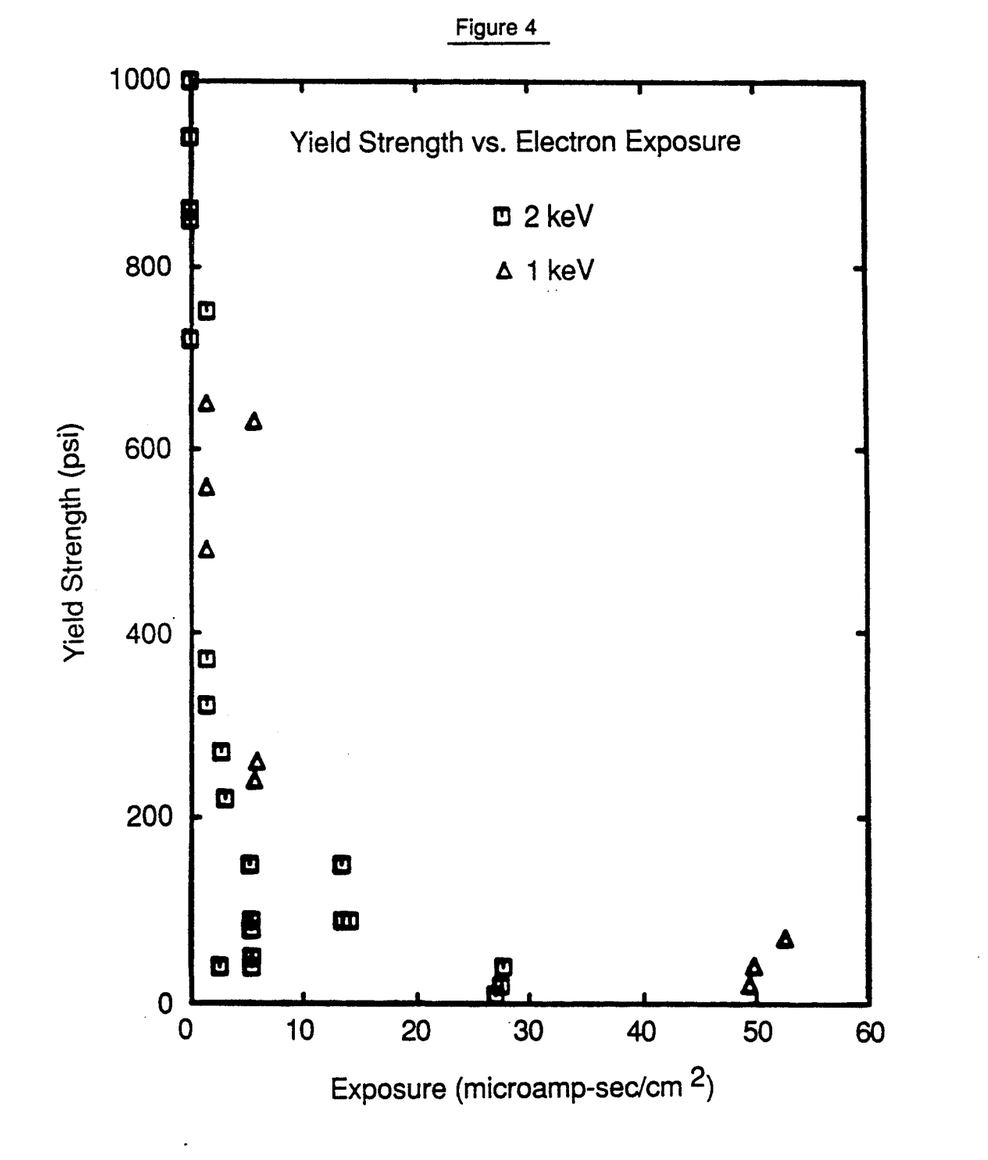
FIG. 4 is a graph of yield strength of an irradiated and etched sample vs. electron exposure.

PTFE samples were prepared for bonding by treating their surfaces to selective electron irradiation, followed by chemical etching. The PTFE samples were then epoxy bonded. FIG. 4 shows a plot of yield strength vs. exposure data for the samples of Example 2. Failure in each case occurrred in the PTFE and not in the bonded transition region. The shape of the yield strength curve and the maximum decrease in yield strength is basically the same as where X-rays were employed as the source of radiation. With X-rays, the yield strength fell to only 3% of the nonirradiated value after a 10 minute X-ray exposure. With electrons, the maximum decrease in yield strength occurred at a minimum exposure of about 5 $\mu$amp-sec/cm$^2$.

While the effect on adhesion for electrons and X-rays are similar, the respective rates of desorption of low molecular weight fluorocarbons produced as by-products of irradiation of PTFE are fundamentally different. The reason for this major difference in fluorocarbon desorption behavior and adhesion behavior is that protection against chemical etching depends on the extent of cross-linking near the surface, whereas desorption behavior depends on the total bulk cross-linking through the product. Since the cross-linking depth distribution is proportional to energy loss depth distribution, the depth distribution of cross-linking for samples irradiated with electrons is fundamentally different from that of samples irradiated with X-rays.

A correlation is observed between X-ray dose and thermal desorption of low molecular weight fluorocarbons produced as by-products of the cross-linking.

The release of low molecular weight fluorocarbons during irradiation can be identified by the mass spectrometer ion currents at mass 69 ($CF_3^+$) and mass 31 ($CF^+$). The very stable $CF_3^+$ at mass 69 is, in general, the dominant mass spectrometer ion fragment of low molecular weight fluorocarbons.

EXAMPLE 3

Figure 5:
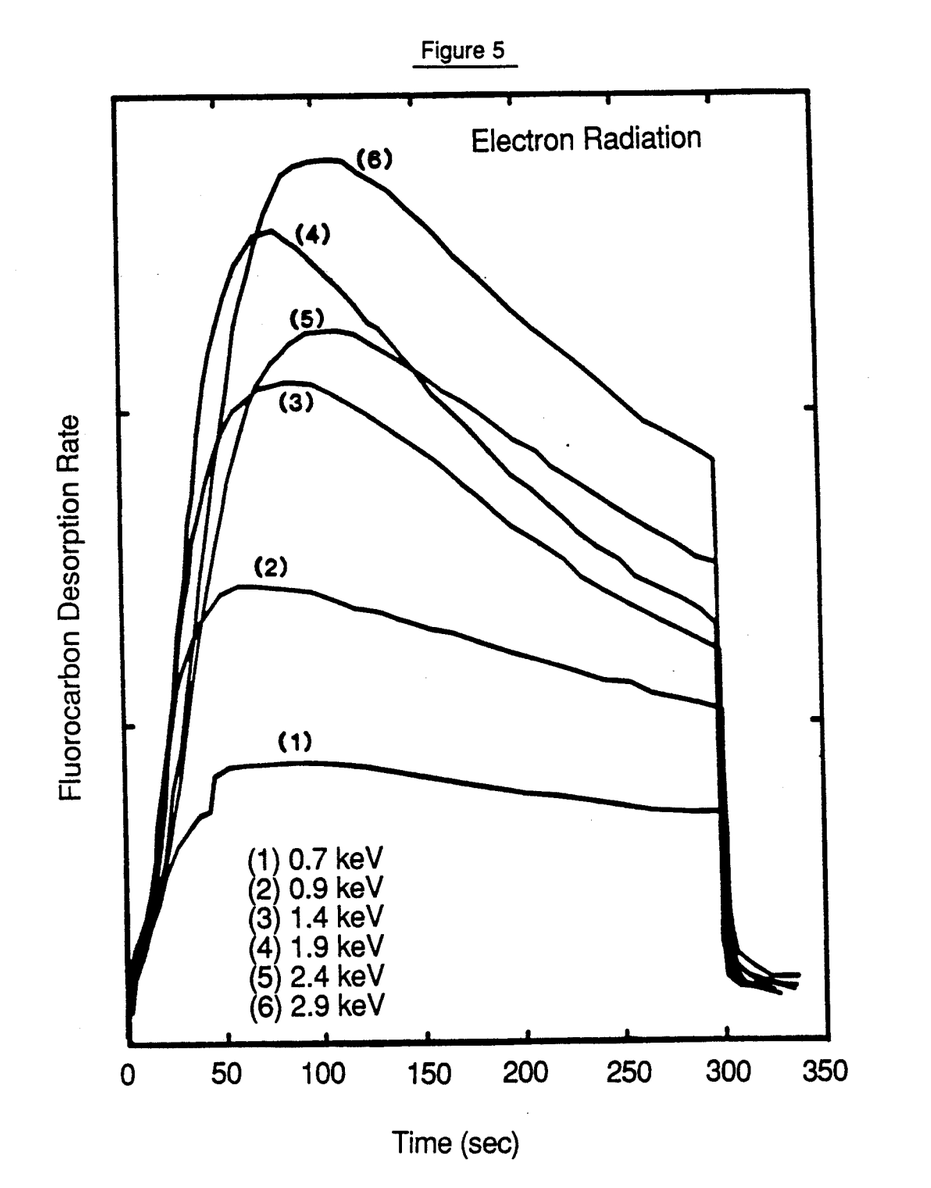
FIG. 5 is a graph of fluorocarbon desorption rate vs. time of irradiation with electrons of different energies.
Figure 6:
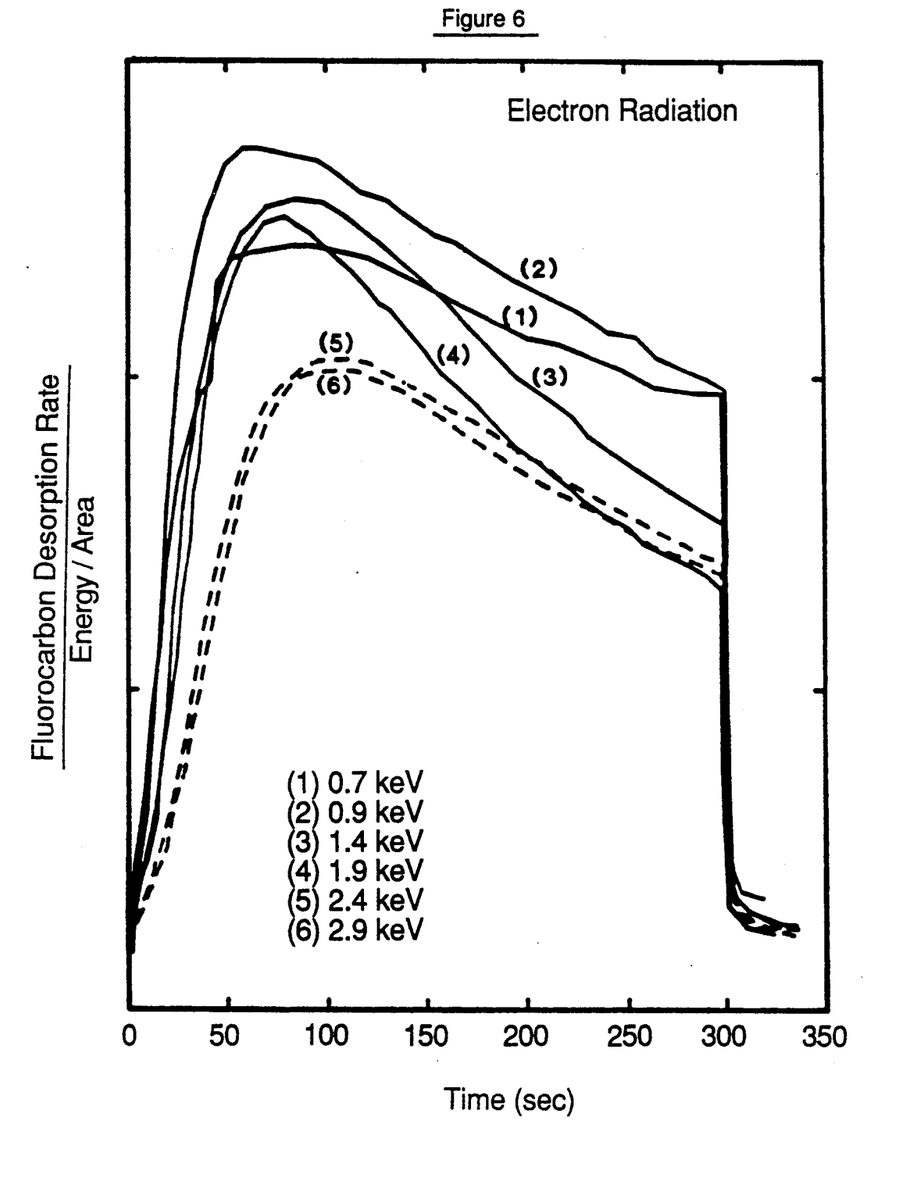
FIG. 6 is a graph which corresponds to that of FIG. 4, with the desorption rate divided by incident energy per unit area plotted vs. time.

A PTFE sample was rastered over a square pattern with a 1.0 $\mu$amp beam of electrons of different energies. The curves in FIG. 5 show the change in the mass 69 ion current as a function of time while rastering. Where the pumping speed is large compared to the desorption rate, the measured pressure (proportional to the ion current) is proportional to the rate of desorption. The set of curves in FIG. 5 therefore reflect the desorption rate as a function of time and incident electron energy for a fixed incident current of 1.0 $\mu$amp. Zero time in FIG. 5 is the time at which the beam was deflected onto the sample to begin rastering. During irradiation, the rate of desorption at each energy increased to a maximum at roughly 100 seconds and subsequently decreased until the beam was deflected off the sample at 300 seconds. Up to about 2 keV, there was in general a continuous increase in desorption rate with increasing energy, although, as seen in FIG. 4, the maximum desorption rate for 2.4 keV electrons was lower than that for 1.9 keV electrons. After the maximum desorption rate was passed, a decrease in desorption rate was observed for each curve. Since irradiation occurs in the vacuum system and produces no visual effect on the PTFE sample, the irradiated area cannot be detected visually. However, after the samples are developed by chemical etching, as in FIG. 3, the shape and areas can be directly measured. Using such measurements of the irradiated areas, the curves in FIG. 5 were replotted in FIG. 6 as fluorocarbon desorption/(energy per unit area). Again, behavior above 2 keV differs from that below 2 keV. Both above and below 2 keV, the maximum rates of desorption vary along respective curves according to the incident energy per unit area.

EXAMPLE 4

Figure 7:
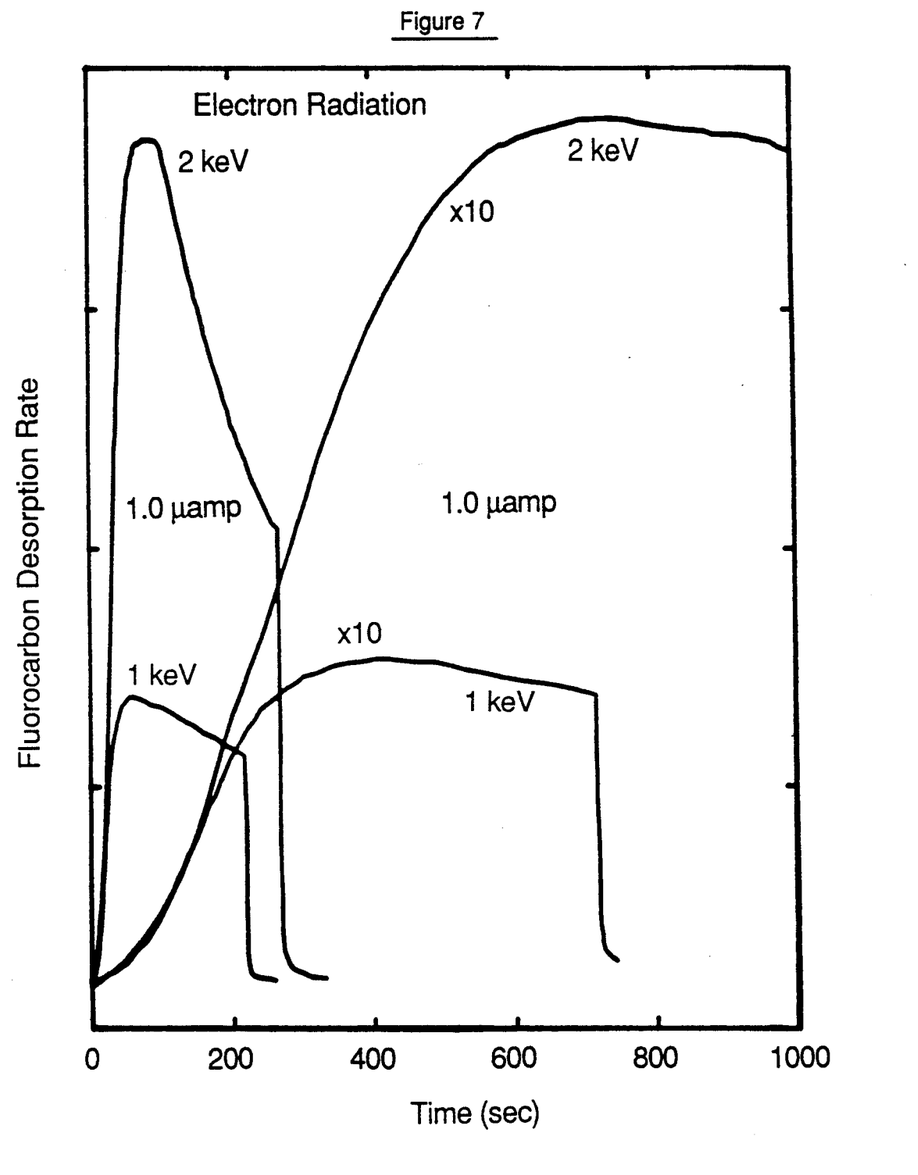
FIG. 7 is a graph of fluorocarbon desorption rate vs. time of irradiation with electrons of 1.0 and 2.0 keV at currents of 0.1 and 1.0 $\mu$amp.

Samples of PTFE were rastered with electrons of 1.0 and 2.0 keV at currents of 0.1 and 1.0 $\mu$amp. With decreasing beam current, as illustrated in FIG. 7, the maximum desorption rate decreases by a factor approximately equal to the factor of decrease in beam current (10, in this case). In addition, the desorption rate peaks later and decreases after the peak at a slower rate.

EXAMPLE 5

Figure 8:
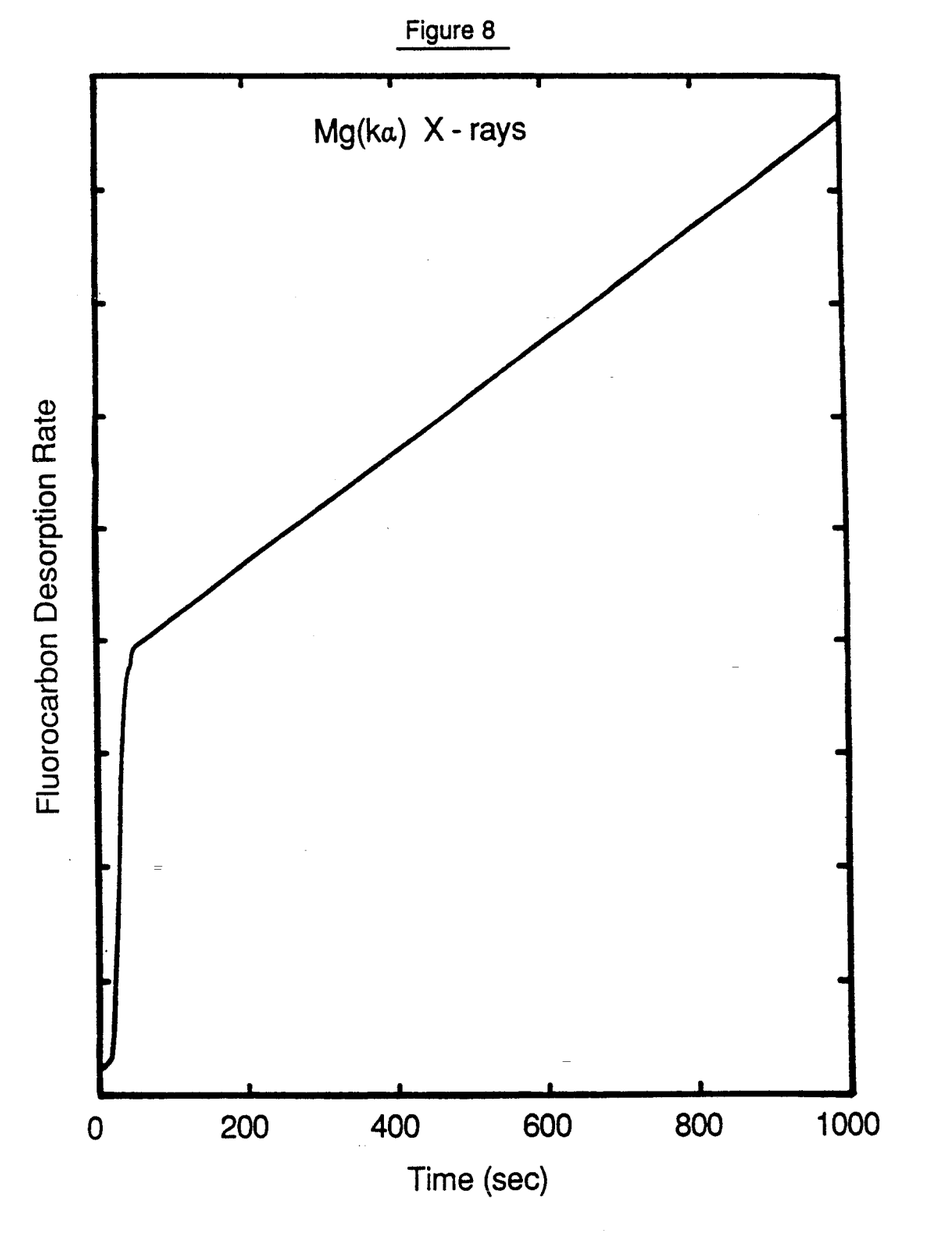
FIG. 8 is a graph of fluorocarbon desorption rate vs. time of irradiation with X-rays.

Samples of PTFE were irradiated with Mg(k$\alpha$) soft X-rays (1253.6 eV). The desorption rate vs. time of irradiation is shown in FIG. 8. With the X-ray source employed, one is limited to a fixed energy and there is no way to accurately measure the incident flux. After stabilizing the X-ray source at an output power, the sample was rotated into the X-ray flux at time zero. In contrast to the use of electrons, the rate of desorption shows an initial large increase, followed by a linear increase with increasing irradiation time.

Figure 9:
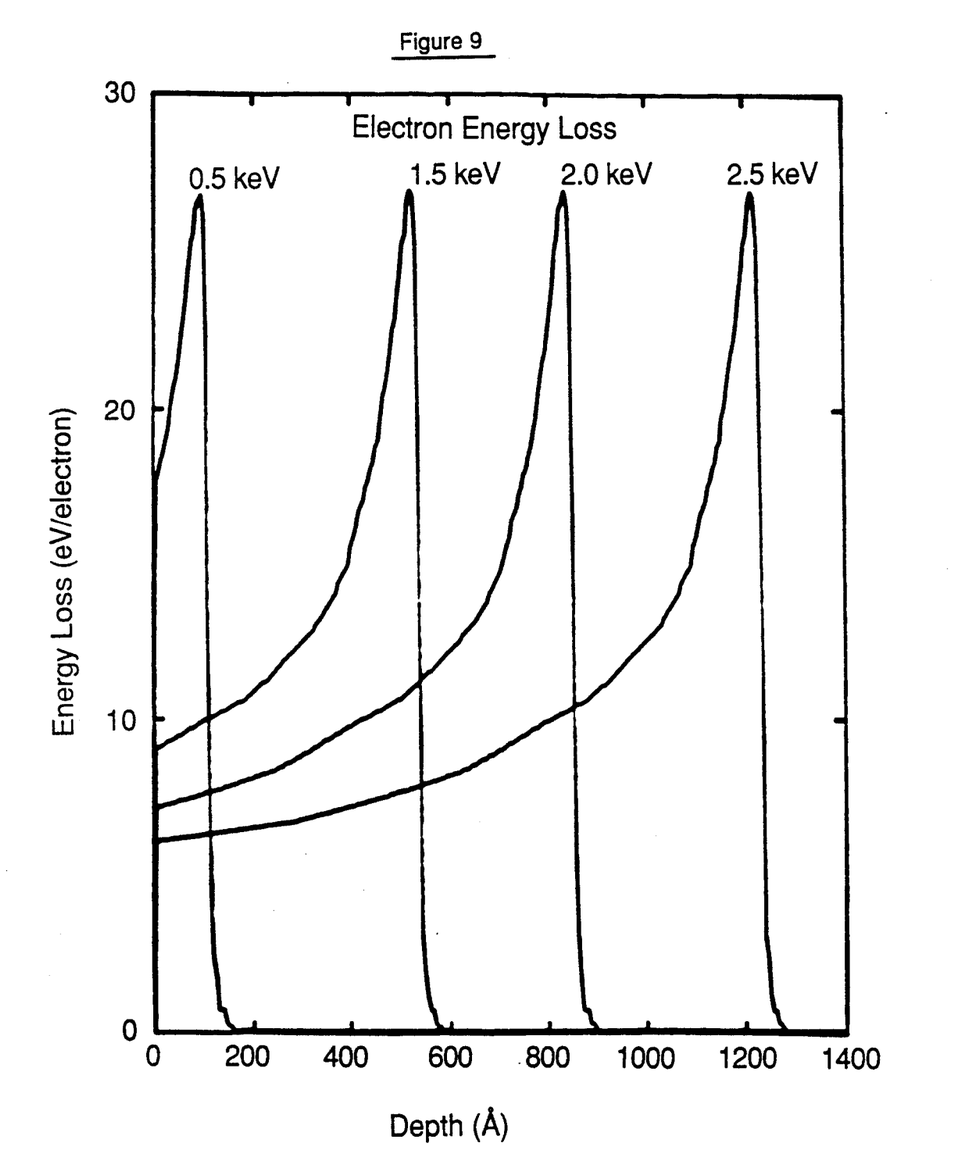
FIG. 9 is a graph of energy loss vs. depth of penetration for electrons of different energies.

FIG. 9 shows the energy lost per electron in 5 Å steps for 0.5, 1.5, 2.0 and 2.5 keV electrons as a function of distance, obtained from mass stopping power data for low energy electrons. The mass stopping power plots in units of MeVcm$^2$/g have the same general shape for different energies, with the maximum stopping power occurring for roughly 100 eV electrons. To approximate the linear stopping power of PTFE, liquid water with an assumed density of 2 g/cm$^3$ was prepared.

Approximate linear stopping power data was generated and used to calculate the energy loss vs. depth curves shown in FIG. 9. These curves do not reflect accurate data for PTFE, but they give a good indication of the shape of the energy loss profile and provide a reasonable measure of the stopping power behavior of PTFE. The curves in FIG. 9 reflect that the maximum energy loss occurs near the end of the range (maximum penetration) where the electrons have lost most of their energy. In general, the maximum depth of penetration is short, only about 280 Å for 1 keV electrons and 840 Å for 2 keV electrons. At all energies, there is an abrupt decrease in the energy loss with distance above the maximum depth of penetration. Below the maximum, the energy loss increases along a more gradual curve. With increasing electron energy, there is a decrease in the energy lost at or near the surface of the article being irradiated.

Figure 10:
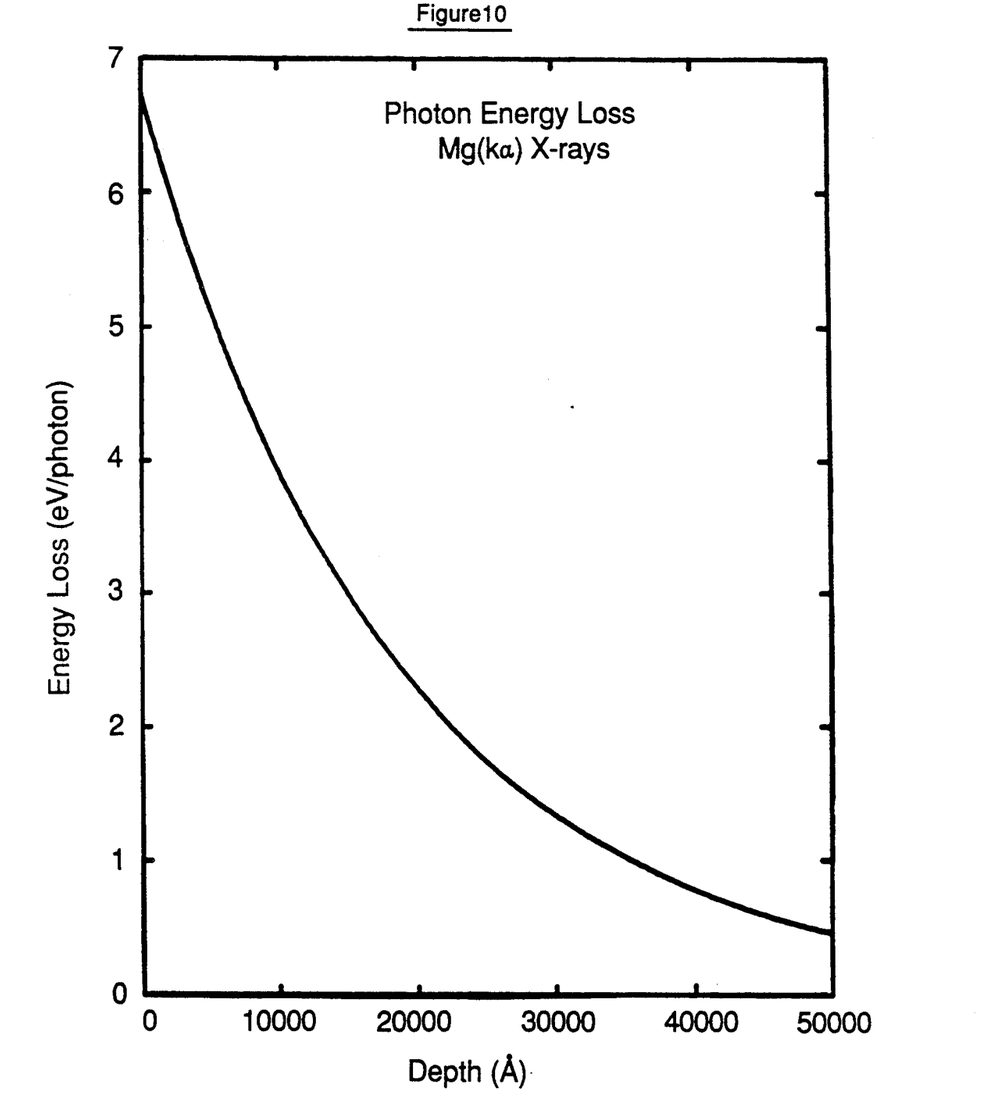
FIG. 10 is a graph of energy loss vs. depth of penetration for Mg(k$\alpha$) X-rays.

The energy loss depth profile for X-rays exhibits a more simple exponential decrease with increasing depth. The curve in FIG. 10 represents the energy lost per photon in 100 Å steps for Mg(k$\alpha$) X-rays in PTFE. In contrast to electron irradiation, where the maximum energy deposition occurred near the maximum range, the maximum loss with X-rays occurs at the surface, and the energy deposition range is much greater, with loss occurring at depths greater than 50,000 Å.

Thus, for adhesion, the major difference between irradiation by photons and by electrons should be in the fraction of energy that is deposited in the near surface region, where the resulting cross-linking can be effective in inhibiting deep chemical etching. Electrons appear to be somewhat more effective in depositing energy in the near surface region. As discussed above, in the data shown in FIG. 9, the maximum range of 2 keV electrons is 840 Å. Referring to FIG. 10, only about 4% of the Mg(k$\alpha$) radiation is absorbed in the first 840 Å.

The flux dependence of adhesion for electrons and photons is characterized as follows. A good measure of the photon flux from the Mg(kα) source is not available, but Wheeler and Pepper, *J. Vac. Sci. Technol.*, 20, 226 (1982) report a flux density of $7 \times 10^{12}$ photons/cm$^2$-sec for an X-ray source similar to the one used in this Example. Referring to FIG. 4, there is no clearly defined reference point in the yield strength vs. exposure data, but a comparison between the effects of electrons and photons can be made from the minimum exposure necessary to cause the maximum effects on adhesion. From the data in FIG. 4, for electrons, this minimum exposure is roughly 5 μamp-sec/cm$^2$. The equivalent point for Mg(kα) X-ray radiation occurs for a dose of roughly 10 minutes. The electron dose corresponds to $3 \times 10^{13}$ electrons/cm$^2$, and the photon dose, using the Wheeler and Pepper flux density, is $4 \times 10^{15}$ photons/cm$^2$. However, in comparison to the case of electrons, only $1.6 \times 10^{14}$ photons/cm$^2$ are absorbed in the first 840 Å, a value which is a factor of 5 larger than the electron particle dose required for the same effect. If comparison is made on the basis of the energy absorbed per unit volume within the same distance from the surface, the agreement is even closer: $2.4 \times 10^{22}$ eV/cm$^3$ for photons and $7 \times 10^{21}$ eV/cm$^3$ for electrons. Thus, electrons and photons appear equally effective in modifying the etching and subsequent adhesion characteristics of PTFE with the important point being that the energy deposition and resulting cross-linking must involve the near surface region.

The minimum electron exposure of 5 μamp-sec/cm$^2$ also provides a rough estimate of the efficiency in terms of the number of electrons per CF$_2$ unit. Assuming that the electrons are equally distributed over their maximum depth (840 Å for 2 keV electrons), the dose per unit volume is $6 \times 10^5$, μamp- sec/cm$^3$ or $3.7 \times 10^{18}$ electrons/cm$^3$. The volume per CF$_2$ unit of $4.2 \times 10^{23}$ cm$^3$/CF$_2$ is obtained from MW/$\rho$N$_O$ where MW is the molecular weight per CF$_2$ unit, $\rho$ is the density (2 g/cm$^3$) and N$_O$ is Avogadro's number. The minimum dose required for a maximum adhesive effect is the equivalent of about $1.6 \times 10^{-4}$ electrons per CF$_2$ unit or about 0.32 eV/CF$_2$. The energy deposited per unit volume in this estimate depends on the ratio of the incident energy to the deposition depth, a ratio which decreases only slowly with increasing energy according to the data in FIG. 9. Therefore, the estimate of 0.32 eV/CF$_2$ should change only slowly with incident energy.

Qualitatively, the same etching behavior is observed for energies between 0.5 and 3.0 keV with respective maximum ranges of about 100 Å and about 1700 Å. It is necessary that the cross-linking be closer to the surface than reported crosslinking depths of about 50,000 Å, and probably very near the surface. The energy loss data in FIG. 9 suggests that as the incident electron energy increases, cross-linking at or near the surface decreases, but that the total cross-linking increases with the maximum moving deeper into the bulk. These changes with energy in the cross-link distribution are expected to have complex effects on the subsequent etching and adhesion behavior. For example, at higher energies, the greater but deeper total cross-linking could compensate for the decrease in cross-linking near the surface and possibly afford the same protection against etching as at lower energies, or it is possible that the increase in the depth of maximum cross-linking with increasing electron energy simply allows etching up to that depth. FIG. 4 suggests that a larger dose is required for 1 keV than for 2 keV electrons, but the scatter in the yield strength data in FIG. 4 is too large to accurately probe the energy or depth dependence.

Since the cross-links that result from radiation do not move unless the sample is subjected to temperatures sufficiently high for polymer self-diffusion, the interpretation of adhesion results in terms of the energy loss depth profiles is relatively straightforward. It is assumed that the cross-link depth distribution reflects the energy loss distribution. The production of low molecular weight fluorocarbon species as by-products of the cross-linking reaction is a much more complicated process due to the movement of fluorocarbon products. Since major qualitative differences between electrons and photons are seen in the energy loss distribution (expected to reflect the depth distribution of fluorocarbon production), one should expect an equally major difference between electrons and photons in fluorocarbon desorption behavior. To gain a qualitative understanding of the behavior of low molecular weight fluorocarbon desorption, at least three possible steps must be considered: 1) fluorocarbon production as a function of depth of penetration by the radiation, 2) transfer to the surface and 3) desorption from the surface. The first of these is expected to be non-activated and lead to distribution of fluorocarbon products with a depth distribution similar to that in FIG. 9 or 10. Steps 2 and 3 alter this distribution. Step 2 is a diffusion process and step 3 is a normal desorption step with the rate of desorption being proportional to the concentration at the surface. Since PTFE is such a low surface energy material, step 3 is expected to be rapid. The important step in explaining differences between desorption behavior caused by irradiation with electrons vs. by irradiation with X-rays is the diffusion step since the profiles in FIGS. 9 and 10 differ so markedly.

With X-rays, the concentration profile will always be such as to favor diffusion into the bulk with the maximum production of fluorocarbons always being at the surface. In order to model the rate vs. time data in FIG. 8, it must be assumed that diffusion is slow compared to either the production or desorption steps. With this assumption, the rate of production of gas phase fluorocarbons, (dn/dt)$_g$ is given by:

$$(dn/dt)_g = (\gamma k_{rad})_{x=0} + k_{des}n_{x=0} \qquad (1)$$

The first term, $(\gamma k_{rad})_{x=0}$ is a direct photodesorption term reflecting the fraction of fluorocarbons produced at the surface that go directly to the gas phase. The nonactivated rate constant k$_{rad}$ is a product of a reaction probability and the incident photon flux. The second term, k$_{des}$n$_{x=0}$, is a normal reaction rate and a product of a rate constant and the surface concentration n$_{x=0}$. The rate of change in surface concentration, (dn/dt)$_{x=0}$, is given by:

$$(dn/dt)_{x=0} = (1-\gamma)k_{rad} + k_{des}n_{x=0} \qquad (2)$$

It should be noted that the rate vs. time curve in FIG. 8 is characterized by an abrupt jump at time zero, followed by a slow linear rise. If the initial jump is associated with the radiation production step, $\gamma k_{rad}$, and the slow rise associated with the desorption term, this would imply that k$_{des}$n$_{x=0}$ is small compared to $(1-\gamma)k_{rad}$. Neglecting the small term, equation 2 integrates to:

$$n_{x=0} = (1-\gamma)k_{des}t. \qquad (3)$$

The combination of equations 3 and 1 gives exactly the form of the rate data in FIG. 8, with the initial large jump in rate due to a direct photo production step, and the subsequent slow linear rise due to a normal desorption step superimposed on the photoproduction step.

Gas phase fluorocarbon production in the case of electrons also corresponds with equation 1 but with the first term being an electron production step instead of a photon production step. For electrons, the energy loss profiles in FIG. 10 imply that the production of fluorocarbons at the surface is small compared to that near the maximum range. Further, the profiles in FIG. 10 indicate that there is a steep concentration profile favoring diffusion into the bulk and a more shallow profile for diffusion to the surface; compared to X-rays, the concentration profile is more localized near the surface. Under these conditions, the diffusion contribution cannot be ignored and the rate of change in surface concentration of fluorocarbons becomes:

$$(dn/dt)_{x=0} = (1-\gamma)k_{rad} + dn/dt)_{diff} + k_{des}n_{x=0} \qquad (4)$$

Since the rate of surface production is small compared to bulk production, it is expected that an initial large jump in rate as is observed with X-rays would not occur. Instead, as in FIG. 5, it is expected that there would be a gradual increase in rate as the diffusion step supplies fluorocarbons to the surface from deeper in the bulk. Faster diffusion to the bulk than to the surface would decrease the concentration spike near the maximum range, and over time, the concentration profile would evolve from one similar to FIG. 10 to a relatively flat profile. A flat concentration profile would essentially eliminate the diffusion term in equation 4, leading to a maximum in the production rate, followed by a decrease as in FIG. 5. It is possible to affect the supply of fluorocarbons, as well, by changing the incident current. Since $(1-\gamma)k_{rad}$ is proportional to the incident flux, a decrease in current would slow the build up of fluorocarbon products, both surface and bulk. The result should be a shift of the maximum fluorocarbon desorption rate to longer times as in FIG. 7.

The energy deposited by electrons at the surface decreases with increasing incident electron energy, but the desorption rate curves (FIG. 5) increase with increasing energy and approximately scale according to the incident energy. This is consistent with the notion that diffusion from the bulk plays a major role in the gas phase production of fluorocarbons during electron radiation. The fact that the desorption rate curve scales with the incident electron energy suggests that the total fluorocarbon production contributes regardless of depth. This is expected in view of the shallow depth to which electrons penetrate.

Although the method in accordance with the present invention has been described in connection with preferred embodiments, it will be appreciated by those skilled in the art that additions, modifications, substitutions and deletions not specifically described may be made without departing from the spirit and scope of the invention defined in the appended claims.

What is claimed is:

1. A photolithographic method for treating an article formed of poly(tetrafluoroethylene), comprising:
    (1) subjecting portions of a surface of said article to ionizing radiation; and then
    (2) subjecting said surface to chemical etching.

2. A photolithographic method according to claim 1, wherein said ionizing radiation comprises Mg(kα) X-rays.

3. A photolithographic method according to claim 1, wherein said ionizing radiation comprises low-energy electrons.

4. A photolithographic method according to claim 3, wherein said low-energy electrons are of energies from 0.5 keV to 3.0 keV.

5. A photolithographic method according to claim 1, wherein said chemical etching comprises treating said surface with sodium in liquid ammonia.

6. A photolithographic method according to claim 1, wherein said chemical etching comprises treating said surface with sodium as a 1:1 complex of sodium and naphthalene.

7. A photolithographic method for enhancing the bondability of selected portions of an article formed of poly(tetrafluoroethylene), comprising:
    (1) subjecting portions of a surface of said article to ionizing radiation; and then
    (2) subjecting said surface to chemical etching, whereby due to said ionizing radiation, said portions of said surface are less affected by said chemical etching, said chemical etching comprising treating said surface with a material selected from the group consisting of sodium in liquid ammonia and sodium as a 1:1 complex of sodium and naphthalene.

8. A photolithographic method according to claim 7, wherein said ionizing radiation comprises Mg(kα) X-rays.

9. A photolithographic method according to claim 7, wherein said ionizing radiation comprises electrons of energies from 0.5 to 3.0 keV.

* * * * *